United States Patent [19]

McKenny et al.

[11] 4,281,398
[45] Jul. 28, 1981

[54] BLOCK REDUNDANCY FOR MEMORY ARRAY

[75] Inventors: Vernon G. McKenny; David L. Taylor, both of Carrollton, Tex.

[73] Assignee: Mostek Corporation, Carrollton, Tex.

[21] Appl. No.: 120,929

[22] Filed: Feb. 12, 1980

[51] Int. Cl.³ .................. G11C 13/00; G11C 11/40
[52] U.S. Cl. ................................. 365/200; 365/210; 307/238.3; 307/441
[58] Field of Search ............... 364/200; 365/189, 200, 365/210, 230, 239; 307/238, 279

[56] References Cited

U.S. PATENT DOCUMENTS

| | | | |
|---|---|---|---|
| 3,753,235 | 8/1973 | Daughton | 365/200 |
| 3,753,244 | 8/1973 | Sumilas et al. | 365/200 |
| 3,897,626 | 8/1975 | Beausoleil | 365/200 |
| 3,940,740 | 2/1976 | Coontz | 365/200 |
| 3,995,261 | 11/1976 | Goldberg | 365/200 |
| 4,032,765 | 6/1977 | Epstein | 365/200 |
| 4,074,236 | 2/1978 | Ishida | 365/200 |
| 4,089,063 | 5/1978 | Takezono | 365/200 |
| 4,183,095 | 1/1980 | Ward | 365/200 |

Primary Examiner—Terrell W. Fears

[57] ABSTRACT

Block redundancy is utilized to improve yield and lower die cost for an electrically programmable read only memory (EPROM). The EPROM is organized 8Kx8 with four primary memory blocks on each side of a central row decoder. Each block includes an array of memory cells, column select, column decode, sense amp, data buffer and other overhead circuitry. One block of redundant circuitry is also provided for each set of four blocks and includes a redundant memory matrix, a redundant column decoder, a redundant column select, a redundant sense amp and a redundant data buffer. Incorporated within each primary memory block is a multiplex logic circuit which is independently programmable to selectively disconnect the associated primary memory block and substitute the redundant memory block, including the redundant column decoder, column select, sense amp and data buffer. Each multiplex logic circuit includes a polysilicon fuse which is permanently programmable from a closed to an open circuit condition by applying a high voltage to the external data bit terminal which corresponds with the defective memory block cells. According to this arrangement, for each group of blocks, one out of four primary memory arrays including the associated column select, column decoder, sense amp and data buffer, may be replaced during wafer testing and after encapsulation.

6 Claims, 3 Drawing Figures

BLOCK REDUNDANCY FOR MEMORY ARRAY

BACKGROUND OF THE INVENTION

1. Field of the Invention

The present invention is related to monolithic memory arrays of the type implemented on semiconductor chips, and in particular to a fault tolerant memory array having block redundancy.

2. Description of the Prior Art

Large scale integration (LSI) techniques have made possible the construction of memory devices having large arrays of binary storage elements on a single chip of silicon. The immediate advantages for such arrangements are the high cell density and low power requirements. In the production of monolithic chips, it is not unusual for the yield of good chips from a silicon wafer to be low, especially during early production runs. For each perfect chip produced, there a number of chips that are almost perfect, having one or more localized defects which render unusable a single cell or a few closely associated cells or clusters of cells.

It will be appreciated that the presence of only one defective cell in an otherwise perfect memory array can render useless the entire memory array.

As cell density increases, the likelihood of processing defects increases. Therefore there is a continuing interest in techniques for improving the yield of perfect arrays, and for repairing or otherwise rendering usable those memory arrays having processing defects.

Several prior art approaches have been implemented for improving yield. For example, error correction codes have been used to correct words read from a memory in which certain bits of a word are stored in defective cells. According to another approach, a discretionary wiring technique is used during processing to bypass defective cells. Additionally, defect-tolerant memory systems have been disclosed in which an entire redundant row or column of cells is substituted for a selected row or column containing one or more defective cells. In such an arrangement, a redundant row of perfect cells is substituted for a row having one or more defective cells by storing the word address of the defective row in a content addressable memory along with the address of the redundant row.

In yet another fault tolerant arrangement, a cell addressable array utilizes a redundant row of cells together with a defective word address register and a comparator circuit for disabling a defective row of cells and replacing it with a redundant row of cells. The word address is stored either by selectively open-circuiting conductive paths in a read only memory, or by selectively grounding bits of the read only memory.

In each of the foregoing fault tolerant arrangements, whether the memory be of the word addressable or cell addressable type, a requirement in each is that at least one redundant line of cells be provided for each row or column in which one or more bad cells exist. Further, faulty bit locations of a memory array can be tolerated only to the extent that rows or columns in which such faulty locations exist do not exceed the total number of redundant rows provided.

Additionally, cell and word addressable arrays typically include decoders, input/output logic, and other overhead circuitry, in which processing defects may occur, and which cannot be cured by word addressable or cell addressable techniques.

SUMMARY OF OBJECTS OF THE INVENTION

Accordingly, the principal object of the present invention is to provide an improved fault tolerant memory array.

Another object of the invention is to provide a fault-tolerant memory system for curing defects in decoders, input/output logic and related overhead circuitry, as well as cell defects.

Still another object of the invention is to provide a fault tolerant memory array in which circuit defects occurring after encapsulation can be cured by programmable means without tear-down of the package.

A further object of the present invention is to provide an improved fault-tolerant memory system in which a memory array having one or more localized defects which render unusable a single cell or a few closely associated cells or clusters of cells can be rendered usable without knowledge of the address locations of the cells.

SUMMARY OF THE INVENTION

The foregoing objects are achieved in a fault tolerant memory system organized in a plurality of primary memory array blocks, each block having data storage cells arranged in rows and columns, with the columns of each primary array being coupled together through data node input/output circuitry for conducting data to or from the cells of each primary array. The fault tolerant memory system further includes a redundant array or block of data storage cells arranged in rows and columns, with the columns of the redundant array being coupled together through redundant data node input-/output circuitry for conducting data to or from the cells of the redundant array. Cell selection means responsive to row and column address code signals are coupled to each array for selectively addressing individual data storage cells at corresponding row and column addresses in each primary array and in the redundant array. A multiplexer logic circuit is coupled to the data node input/output circuitry of each primary array and to the redundant data node input/output circuitry of the redundant array for selectively gating data from the primary array to which it is attached, or, when programmed, to data from the redundant array to an external bit data pin. Each multiplexer logic circuit includes an independently programmable element for logically disabling the output of the primary array to which it is attached and simultaneously enabling data transmission through the redundant array.

According to a preferred embodiment, the programmable element comprises a semiconductor fuse, and fusing circuitry. Upon the detection of one or more defects in a primary memory block, a relatively high voltage, typically 25 volts, is applied to the fusing circuitry through the external bit data pin which causes the semiconductor fuse to be permanently altered from a closed circuit low resistance condition to an open circuit condition, thereby permanently disconnecting the defective primary memory block and substituting in its place the redundant memory block. Each primary memory block preferably includes column select, column decode, sense amp and data buffer circuitry, all of which are duplicated in the redundant memory block, whereby defects in a substantial portion of the cell selection and data detection circuitry can also be cured.

The novel features which characterize the invention are defined by the appended claims. The foregoing and

DETAILED DESCRIPTION OF A PREFERRED EMBODIMENT

Figure 1:
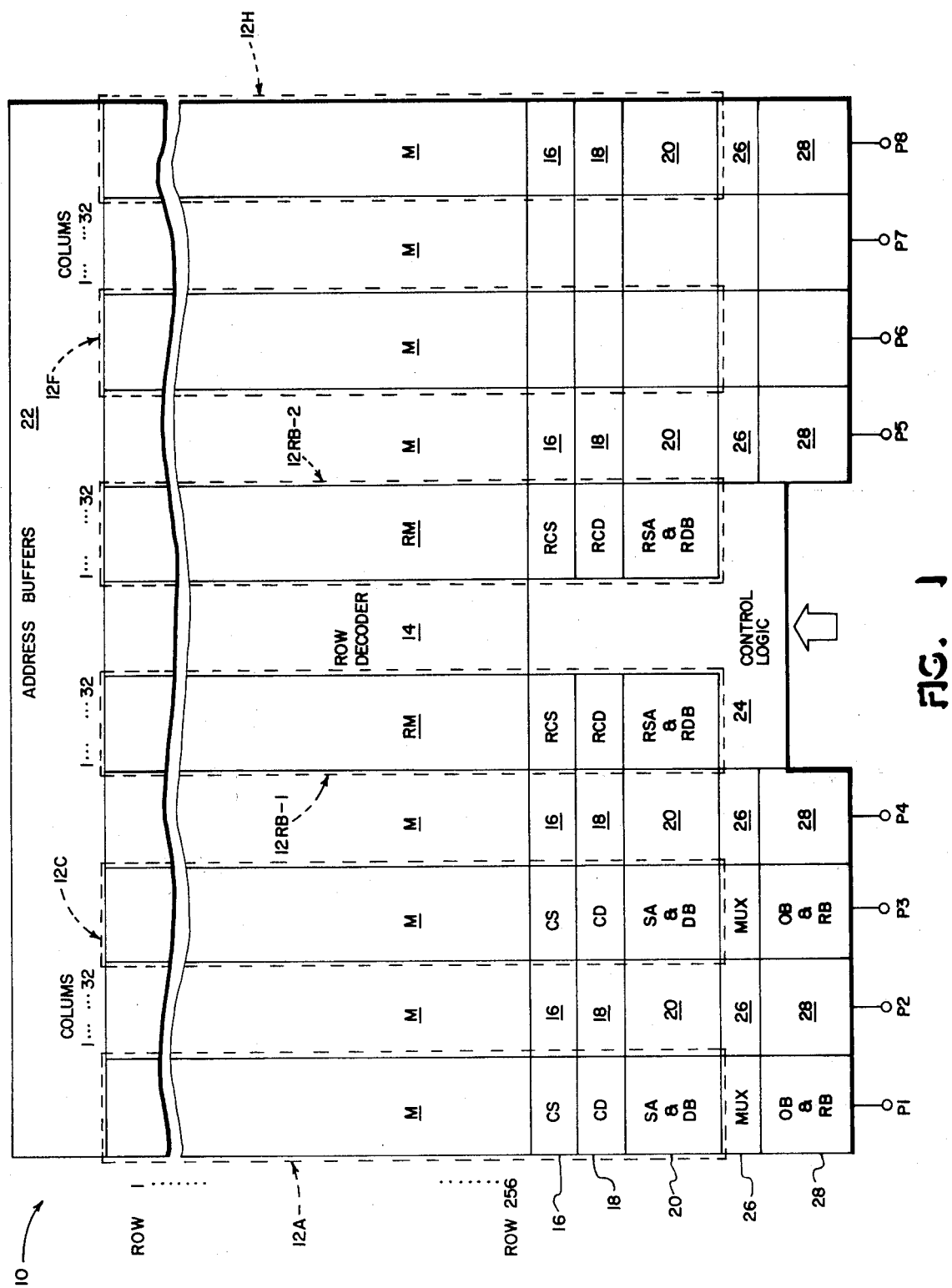
FIG. 1 is a block diagram which illustrates the chip architecture of a memory system having block redundancy.

In the description which follows, the invention is described in combination with an electrically programmable read only memory (EPROM) which is implemented by MOS/LSI techniques on a semiconductor chip. It will be appreciated, however, that the block redundant circuitry and technique disclosed herein may be used to good advantage for memory arrays which are organized generally in the form MK× Q.

Like parts are marked throughout the specification and drawings with the same reference numerals, respectively.

Figures 2, 3:
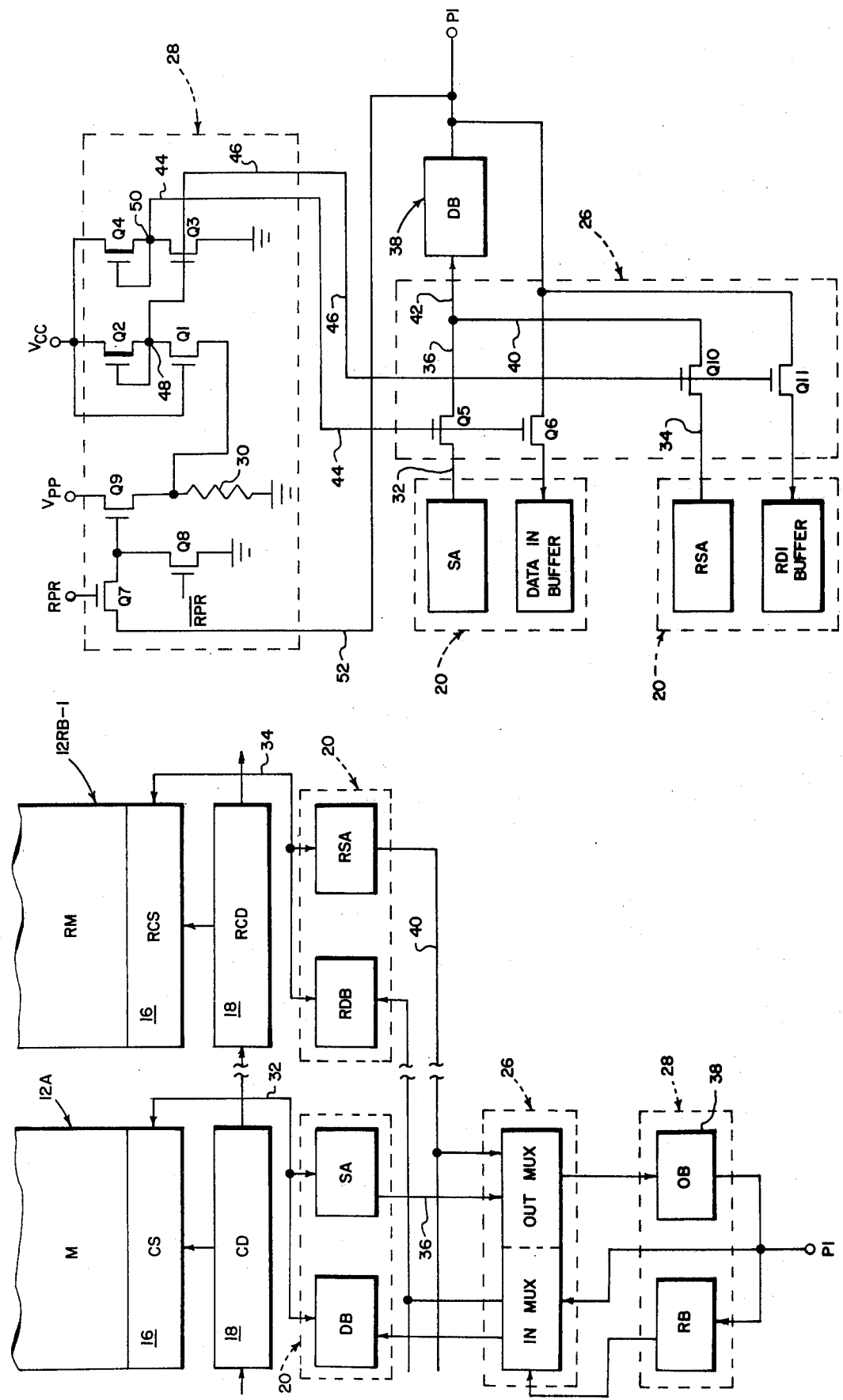
FIG. 2 is a simplified circuit diagram for the logic multiplexer of the invention; and, FIG. 3 is a simplified block diagram which illustrates the logical interconnection of a primary memory array with a redundant memory array.

Referring now to the drawings, and in particular to FIGS. 1 and 2, an electrically programmable, read only memory (EPROM) is implemented by MOS/LSI techniques on a semiconductor chip 10. The EPROM is organized 8K×8 with four primary memory blocks 12ABCD and 12EFGH on each side of a central row decoder 14. Each primary memory block includes data storage cells arranged in a memory array M of 256 rows and 32 columns, with the columns of each array M being coupled through data node input/output circuitry for conducting data through common data input/output terminals P1, P2, P3, P4, P5, P6, P7 and P8, respectively. Each primary memory block also includes column select circuitry 16, column decoder 18, and sense amp and data buffer circuitry 20. Also provided is an address buffer block 22 which serves both row and column decoders, and a common control logic block 24 which sends control signals to all parts of the chip. The row decoder 14, column select 16, column decoder 18 and address buffer block 26 receive the address information and select one out of 256 rows and one out of thirty-two columns for each block to select an individual cell in each block for read/write operations. For example, the row decoder may be of the type which decodes an n-bit binary input signal to generate a one of $2^n$ signal to select one of $2^n$ rows, and the column decoder may be of the type which decodes an N-bit binary input signal to generate a one of $2^N$ signal to select one of $2^N$ columns in each block.

The cells in each block extend along common row lines, and are separately addressable. The bit column lines in each block are common to two columns of data which are also selectable by two different column addresses. The column bit lines of each block are coupled through data node input/output circuitry (SA & DB) 20 for conducting data to or from the cells of the array through the external pins P1–P8.

As previously discussed, the principal object of the invention herein is to provide a circuit technique for improving yield and thereby lowering the cost of a semiconductor memory array. This is achieved in the present invention by providing redundant circuitry which can be selectively enabled to replace entire memory blocks having defective cells or clusters of cells, thereby salvaging an otherwise defective chip. As will be seen below, the redundancy technique of the present invention may be carried out equally well during the testing stage both before and after encapsulation.

The redundant technique of the invention is "block" redundancy in that one full block of memory is replaced, rather than one row or one column. In the memory array implemented on the chip 10, data storage cells are arranged in 256 rows and 256 columns, with the columns being grouped in eight outputs, so that the memory array is organized in eight memory blocks which are each thirty-two columns wide. According to the redundancy technique of the invention, two additional blocks, redundant matrix blocks 12RB-1 and 12RB-2 are included as the ninth and tenth blocks of the matrix. Each redundant block includes data storage cells arranged in a redundant memory array RM of 256 rows and 32 columns, redundant column select circuitry (RCS) 16, redundant column decode ciruitry (RCD) 18, and redundant sense amp and data buffer circuitry (RSA & DB) 20. The data storage cells in the redundant blocks are addressed simultaneously with the cells of the primary memory blocks.

Upon determining during testing that some portion of a memory block is bad, that memory block is selectively disconnected by programmable means and the redundant memory block for that side of the chip is connected in its place. The redundant block is selectively inserted for the block of the matrix that is bad, not only as probed during wafer testing, but after encapsulation during data retention tests. If a bad bit is detected, the redundant block can be selectively substituted for the defective block either at the wafer level or at the package level. According to this technique, even though only one bit is bad, an entire block of memory is replaced, not just a single row or column. This block redundancy technique is independent of any address in consideration because it duplicates the entire column address and row address sequence.

Block selection is implemented through a multiplexer 26 and a repair buffer 28 which are coupled to the data node input/output circuitry (SA & DB)20. The redundant block substitution is carried out by selectively applying a high voltage on the output data terminal of the block in which the bad bit is located. Blowing a polysilicon fuse 30 in the repair buffer (RB) 28 electrically disconnects the bad block of memory while simultaneously substituting the redundant block in its place.

Referring now to FIGS. 2 and 3, the multiplexer circuit 26 is coupled to the sense amp (SA) output node 32 of each primary memory block. Data from the memory block 12A enters the multiplexer through SA output node 32, while data from the redundant matrix RM in block 12RB-1 enters from the RSA output node 34. It should be understood that this arrangement is duplicated for the opposite side of the chip 10, and that similar circuitry for both sides of the chip are included for WRITE operations. The READ operation for the memory blocks of the left side of the chip 10 will therefore serve for explanation of the redundant technique.

The multiplex logic circuit 22 has first and second data inputs, the sense amp output node 32 and RSA output node 34 from the primary memory block 12A and redundant block 12RB-1, respectively. The data output of the multiplexer is conducted along a primary data path 36 or along a redundant data path 40 through an output buffer 38 to pin P1. The data appearing on either the primary memory block SA output line 32 or on the redundant SA output line 34 will be conducted depending upon the state of the programmable fuse 30 in the repair buffer 28. Assuming that the memory block 12A contains an array of perfect cells, and that the programmable fuse 38 is intact, data will be conducted from the SA output line 32 to the I/O bit data terminal P1 through a common data bit node 42 which forms the input to the output buffer 38.

The condition of the programmable fuse 30 determines the data path selected by the multiplexer 26. Multiplexer 26 includes first and second input control lines 44, 46 which are coupled to the repair buffer 28. A logic high level potential, $V_{CC}$, or logic low potential, zero or substrate reference potential, will appear on the control input lines 44, 46 depending upon the open circuit or closed circuit condition of the fuse 30.

Assuming that the memory block 12A contains an array of perfect cells, the fuse 30 will be intact. The resistance of the programmable fuse 30 is relatively low, typically 100–200 ohms, whereby a low resistance conductive path is established for a control transistor Q1. The gate of transistor Q1 is coupled directly to $V_{CC}$, and is turned on, thereby establishing a conductive path for depletion mode transistor Q2. The depletion mode transistor Q2 is normally on, in the absence of a turn-off signal, and is turned off when Q1 begins conducting through the fuse 30. Although the voltage drop across the fuse 30 is not zero, the potential applied to the gate of depletion mode transistor Q2 is substantially at substrate reference level, thereby causing it to turn off.

The potential at the control node 48 is at substrate reference or logic zero level. The gate of a control transistor Q3 is coupled to the control node 48, and is also turned off at the same time. The source of control transistor Q3 is connected to the drain of a depletion mode transistor Q4 through a control node 50. The gate of the depletion mode transistor Q4 is coupled to the control node 50, so that the control node 50 rises to a potential level of approximately $V_{CC}$ when Q3 turns off. Thus the multiplex control input line 44 rises to $V_{CC}$ or logic high condition, thereby turning on control transistors Q5 and Q6 in the multiplexer 26, thereby enabling data input and data output from pin P1 to the data storage cells of the primary memory block 12A.

If, during testing, it is determined that one or more cells in the memory array M of a primary block is bad, for example block 12A, it is desirable then to substitute the redundant block 12RB-1 in its place. This is carried out by conducting a signal RPR on the gate of a control transistor Q7 while at the same time impressing a relatively large voltage, for example 25 volts, on pin P1. The programming signal represented by the relatively high potential is conducted through a program input conductor 52 which is coupled to pin P1 and to the source of Q7. As signal RPR rises from logic zero to logic one, the complement repair signal $\overline{RPR}$ falls to logic zero, thereby turning off control transistor Q8. Programming current is conducted through transistor Q9 when the relatively high voltage carried by the program input conductor 52 is applied to its gate. The programming current is derived from a separate power supply potential $V_{PP}$. The application of the repair signal to the gate of Q9 causes it to conduct, thereby delivering heavy current flow through the fuse 30.

After the fuse 30 has been opened by this heavy flow, the drain of control transistor Q1 is open circuited, whereby its source, which is coupled to the drain of depletion mode transistor Q2, rises to $V_{CC}$ potential level. With the potential of node 48 being $V_{CC}$, the multiplex control input 46 rises to $V_{CC}$, or logic one, and at the same time, transistor Q3 is turned on, thereby driving control node 50 to logic zero potential. Since multiplex control input 44 is coupled to the control node 50, the control transistors Q5 and Q6 for the primary block 12A are turned off, while control transistors Q10 and Q11 are turned on by the logic high potential level on multiplex control input 46. Thus with the fuse 30 permanently programmed to its open circuit condition, the redundant block 12RB-1 is permanently substituted for the primary block 12A, whereby data may be written into and read out of the memory cells of the redundant matrix RM through I/O data pin P1.

It will be appreciated that the foregoing technique allows most memory array defects to be repaired, and in addition, allows the replacement of defective column decoders, column select circuitry, data-n buffers and the sense amp. Although many row line defects cannot be repaired, all individual memory cell problems and column problems can be cured.

Previously, redundancy in a memory chip has been implemented by providing a few additional rows and/or columns. While this approach requires less matrix area, it cannot repair column decoders or sense amps, and in addition has its own inherent implementation problems, including the requirement for a programmed logic array to store cell address information. For a certain memory arrangement, in which a column bit line is shared by two columns of data which are also selectable by two different column addresses, a drain-to-source short or drain-to-floating gate short in the memory cell would be nonrepairable unless the bad column address line is permanently connected to ground at the same time the column address is activated. This would require a polysilicon fuse and considerable additional circuitry to be associated with each of the densely packed column address line. Likewise, the circuit designer must assure that both ends of a replaced row line is permanently connected to ground. This leads to even more severe circuit packing density problems since the row address line pitch is twice as dense as a column address line pitch, and also since there are four ends of the polysilicon row line, as in the present example, when the row decoder is placed in the middle of the memory array. This approach requires a large amount of overhead circuitry.

Since the redundant block approach of the present replaces an entire array, including column decoder, sense amp and other overhead circuitry, defects in those areas as well as memory cell defects can be easily replaced. Although block redundancy increases the area of the array, column decoders, sense amps, etc., by 25%, it still requires only the original amount of area to be functionally good. The increase in total chip area is 20%, but the increase in required good active area is less than 2%. The chip area required to implement one redundant column per output in four redundant rows signficantly exceeds the area required to implement the block redundancy approach described herein.

While a particular embodiment of the invention has been illustrated and described in detail, it will be apparent that various modifications can be made without departing from the spirit and scope of the invention.

What is claimed is:

1. A fault tolerant memory system comprising:
   a plurality of primary memory blocks having data storage cells arranged in rows and columns;
   a redundant memory block of data storage cells arranged in rows and columns;
   data detection means coupled to each primary and redundant memory block, said data detection means each including a data output node for separately conducting data from the storage cells of the block to which it is coupled to an external data terminal in response to row and column address signals;
   a multiplexer circuit coupled to the data detection means for each primary memory block and to the corresponding external data terminal, each multiplexer circuit having primary and redundant data input nodes and a data output node, each primary data input node being coupled to the data output node of the corresponding data detection means, each redundant data input node being coupled to the data output node of the redundant memory block data detection means, and each multiplexer data output node being separately coupled to the corresponding external data terminal; and,
   independently programmable means for selectively rendering each multiplexer circuit from a first stable state to a second stable state, a first data path being established from the primary data node of the corresponding primary memory block to the corresponding external data terminal when the multiplexer citcuit is in its first stable state, and a second data path being established from the redundant data node of the redundant memory block to the corresponding external data terminal when the multiplexer is in its second stable state.

2. The fault tolerant memory system as defined in claim 1, each data detection means comprising a sense amp and a data buffer.

3. The fault tolerant memory system as defined in claim 1, said independently progrrammable means each comprising a repair buffer including a polycrystalline silicon fuse and a gate circuit coupled to said fuse for conducting heavy current flow through said fuse in response to a repair signal applied to the gate circuit and a programming voltage applied to the corresponding external data pin.

4. The fault tolerant memory system as defined in claim 1,
   each multiplexer including first and second gate circuits connected in series electrical relation with the output data node of the corresponding primary memory block and redundant block, respectively, and each gate circuit having an output node connected in common for conducting data to the corresponding external data terminal; and,
   each independently programmable means including a fuse and a switching circuit coupled to said fuse, said switching circuit having first and second output nodes coupled to the first and second multiplexer gate circuits, respectively, the switching circuit developing enable and complement enable signals on the first and second output nodes, respectively, when said fuse is intact, and developing complement enable and enable signals on the first and second output nodes, respectively, when said fuse is in open circuit condition.

5. A fault tolerant memory system comprising, in combination:
   a plurality of primary memory blocks each including multiple rows and columns of data storage cells;
   a redundant memory block including multiple rows and columns of data storage cells;
   cell selection means coupled to each primary and redundant memory block for simultaneously addressing a cell at identical row and column addresses in each block;
   data detection means coupled to each cell selection means having an output data node separately conducting data to one of a plurality of external data terminals;
   a multiplexer coupled to the data detection means of each primary memory block, each multiplexer having first and second control inputs, first and second data inputs, and a common data output, the first and second data inputs being connected to the data output node of the primary block data detection means and to the data output node of the redundant block data detection means, respectively, and the common data output being coupled to the corresponding primary block external data terminal; and,
   independently programmable means coupled to each multiplexer for logically enabling data transmission exclusively from the corresponding primary memory block or exclusively from the redundant memory block.

6. In a memory system of the type including a primary memory block having data storage cells arranged in rows and columns and cell selection/data detection circuitry for conducting data from the cells to an external data terminal, the improvement comprising:
   a redundant memory block having data storage cells arranged in rows and columns and cell selection/data detection circuitry for conducting data from the cells of the redundant block;
   a multiplexer interposed between the primary memory block, the redundant memory block and the external data pin for selectively enabling the transmission of data exclusively from the primary memory block or exclusively from the redundant memory block to the external data terminal; and,
   independently programmable means coupled to the multiplexer for controlling its operation, said programmable means being characterized by first and second programmable stable states, wherein data transmission from the primary memory block to the external data pin is enabled in response to the first stable state, and data transmission from the redundant memory block being enabled in response to the second stable state.

* * * * *